US010062737B2

(12) United States Patent
Hong et al.

(10) Patent No.: US 10,062,737 B2
(45) Date of Patent: Aug. 28, 2018

(54) OLED PIXEL ARRANGEMENT STRUCTURE AND DISPLAY DEVICE

(71) Applicant: TRULY (HUIZHOU) SMART DISPLAY LIMITED, Huizhou, Guangdong (CN)

(72) Inventors: Zhihua Hong, Guangdong (CN); Xiaoyi Cai, Guangdong (CN); Xianjun Ke, Guangdong (CN); Junhai Su, Guangdong (CN); Yaqing Huang, Guangdong (CN); Jianhua Li, Guangdong (CN)

(73) Assignee: TRULY (HUIZHOU) SMART DISPLAY LIMITED, Huizhou, Guangdong (CN)

( * ) Notice: Subject to any disclaimer, the term of this patent is extended or adjusted under 35 U.S.C. 154(b) by 0 days.

(21) Appl. No.: 15/538,364

(22) PCT Filed: Jul. 29, 2015

(86) PCT No.: PCT/CN2015/085423
§ 371 (c)(1),
(2) Date: Jun. 21, 2017

(87) PCT Pub. No.: WO2016/101619
PCT Pub. Date: Jun. 30, 2016

(65) Prior Publication Data
US 2017/0352710 A1  Dec. 7, 2017

(30) Foreign Application Priority Data

Dec. 22, 2014  (CN) .......................... 2014 1 0800360

(51) Int. Cl.
H01L 27/32 (2006.01)

(52) U.S. Cl.
CPC ...... *H01L 27/3218* (2013.01); *H01L 27/3216* (2013.01)

(58) Field of Classification Search
CPC . H01L 27/32; H01L 27/3216; H01L 27/3211; H01L 27/3213
See application file for complete search history.

(56) References Cited

U.S. PATENT DOCUMENTS 9,583,034 B2 * 2/2017 Hwang ..................... G09G 3/20
9,798,133 B2 * 10/2017 De Greef ............. G02B 26/005
(Continued)

FOREIGN PATENT DOCUMENTS

CN  102986228 A  3/2013
CN  103311266 A  9/2013
(Continued)

OTHER PUBLICATIONS

International Search Report for PCT/CN2015/085423, dated Nov. 11, 2015, ISA/CN.

*Primary Examiner* — Phuc Dang
(74) *Attorney, Agent, or Firm* — U.S. Fairsky LLP; Yue (Robert) Xu

(57) ABSTRACT

An OLED pixel arrangement structure includes multiple first sub-pixels, multiple second sub-pixels and multiple third sub-pixels. Four adjacent ones of the first sub-pixels and four adjacent ones of the second sub-pixels are alternately arranged and surround one of the third sub-pixels. Centers of the four adjacent first sub-pixels and centers of the four adjacent second sub-pixels form vertexes of a virtual octagonal cell, and the virtual octagonal cell has at least two orthogonal symmetry axes, a basic pixel unit is formed by the first sub-pixels and the second sub-pixels forming the virtual octagonal cell and a part of the third sub-pixel inside the virtual octagonal cell which are located on one side of one of the at least two orthogonal symmetry axes of the
(Continued)

virtual octagonal cell. A center of the third sub-pixel coincides with a center of the virtual octagonal cell.

18 Claims, 4 Drawing Sheets

(56) References Cited

U.S. PATENT DOCUMENTS

| | | | |
|---|---|---|---|
| 2006/0274090 | A1 | 12/2006 | Koyama et al. |
| 2012/0268357 | A1* | 10/2012 | Shih .................... G09G 3/3607 345/88 |
| 2013/0107087 | A1 | 5/2013 | Okada et al. |
| 2013/0234917 | A1 | 9/2013 | Lee |
| 2014/0319484 | A1 | 10/2014 | Kwon |

FOREIGN PATENT DOCUMENTS

| | | | |
|---|---|---|---|
| CN | 103474001 | A | 12/2013 |
| CN | 104124265 | A | 10/2014 |
| CN | 104576695 | A | 4/2015 |

\* cited by examiner

OLED PIXEL ARRANGEMENT STRUCTURE AND DISPLAY DEVICE

The present application is the national phase of International Patent Application No. PCT/CN2015/085,423, titled "OLED PIXEL ARRANGEMENT STRUCTURE AND DISPLAY DEVICE", filed on Jul. 29, 2015, which claims the priority to Chinese Patent Application No. 201410800360.X, titled "OLED PIXEL ARRANGEMENT STRUCTURE AND DISPLAY DEVICE", filed on Dec. 22, 2014 with the State Intellectual Property Office of the People's Republic of China, both of which are incorporated herein by reference in entireties.

TECHNICAL FIELD

The present disclosure relates to the technical field of semiconductor manufacture, and in particular to an OLED pixel arrangement structure and a display device.

BACKGROUND

In recent years, an organic light-emitting diodes (OLED) display has become a newly developed display device, and has been widely used in smart phones, televisions, mobile wearable devices, and micro-displays. This is because the OLED display has technical advantages of active light emission, a high response speed (1 µm), a wide color gamut, a high contrast, a low power consumption, a light weight, a thin thickness and good transparency, which perfectly satisfy the requirements of people in mobile Internet age on portability and flexible folding. Therefore, OLED is known as an excellent display technology to replace LCD.

The side-by-side pixilation of three primary colors of red (R), green (G), and blue (B) is the most mature technology among OLED full-color methods. In general, three types of sub-pixels of R, G, and B are alternately and repeatedly arranged in a plane, and three adjacent sub-pixels form a pixel unit which may emit any color, that is, a basic image unit. The pixel units are repeatedly arranged in the plane to form a display screen. The smaller size of the pixel indicates a higher resolution or the PPI (Pixels Per Inch) of the display, and a clearer displayed picture.

At present, in terms of device manufacture, vacuum evaporation is the most mature technology to form an OLED organic layer, in which small organic molecules are heated by an evaporation source, and are changed from an aggregation state to a gaseous state, to be deposited on a right above substrate. A fine metal mask (FMM) is attached to the underside of the substrate. The FMM has a pattern formed by a large number of meshes, such that in depositing sub-pixels of a color, other sub-pixels and non-coated regions between sub-pixels which do not require to be coated are sheltered, and only the sub-pixels required to be coated are coated. Nowadays, the resolution of the display device is required to be higher and higher, which requires the size of the pixel to be smaller and smaller. However, a PPI value of a conventional OLED which has a structure that sub-pixels R, G, and B are alternately and repeatedly arranged, has been close to a limit due to the limitation of the FMM manufacturing process and the coating process.

In order to overcome the limitation of the FMM manufacturing process, an existing pixel arrangement structure is to gather the sub-pixels of the same color together, so that two, three or four sub-pixels can be formed by evaporation through only one FMM hole. However, since a distance between sub-pixels becomes larger, the pixel arrangement structure has a serious disadvantage of graininess in monochrome displaying.

Another existing pixel arrangement structure is that a pixel is formed by sub-pixels of red (R) and green (G) or by sub-pixels of blue (B) and green (G), which achieves a high PPI by sharing sub-pixels of R and B. However, the pixel arrangement structure has a poor display effect for true colors.

SUMMARY

In view of the above, it is essential to provide an OLED pixel arrangement structure and a display device for improving image quality and effect of OLED display.

An OLED pixel arrangement structure is provided according to the present disclosure. The OLED pixel arrangement structure includes multiple first sub-pixels, multiple second sub-pixels, and multiple third sub-pixels. Four adjacent ones of the first sub-pixels and four adjacent ones of the second sub-pixels are alternately arranged and surround one of the third sub-pixels. Centers of the four adjacent first sub-pixels and centers of the four adjacent second sub-pixels form vertexes of a virtual octagonal cell, and the virtual octagonal cell has at least two orthogonal symmetry axes. A basic pixel unit is formed by the first sub-pixels and the second sub-pixels forming the virtual octagonal cell and a part of the third sub-pixel inside the virtual octagonal cell which are located on one side of one of the at least two orthogonal symmetry axes of the virtual octagonal cell. A center of the third sub-pixel coincides with a center of the virtual octagonal cell.

A display device is provided according to the present disclosure. The display device includes the above OLED pixel arrangement structure.

In the above OLED pixel arrangement structure and the display device, the multiple first sub-pixels, the multiple second sub-pixels, and the multiple third sub-pixels are repeatedly arranged in the structure of the virtual octagonal cell, and the basic pixel unit is defined as a half of the virtual octagonal cell, which overcomes limitations of an FMM manufacturing process and a coating process. Therefore, a PPI value and resolution of OLED display are effectively improved, and image quality and effect of the OLED display are improved.

BRIEF DESCRIPTION OF THE DRAWINGS

To illustrate technical solutions according to embodiments of the present disclosure or in the conventional technologies more clearly, drawings to be used in the descriptions of the embodiments or the conventional technologies are described briefly hereinafter. Apparently, the drawings described hereinafter are only for some embodiments of the present disclosure, and other drawings may be obtained by those skilled in the art based on those drawings without creative efforts.

DETAILED DESCRIPTION OF THE EMBODIMENTS

For better understanding of the present disclosure, the present disclosure will be fully described hereinafter with reference to accompanying drawings. The drawings illustrate preferred embodiments. The present disclosure can be embodied in many different forms and is not limited to the embodiments described herein. The purpose of providing these embodiments is to make the content disclosed by the present disclosure to be more thoroughly and comprehensively understood.

It should be noted that, when an element is described as "being arranged on" another element, the element may be directly located on another element, or there may be an element between them. When an element is described as "being connected to" another element, the element may be directly connected to another element, or there may be an element between them. Terms "vertical", "horizontal", "left", "right" and similar expressions used herein are only for illustrative purposes, but do not represent a unique embodiment.

Unless otherwise defined, all technical and scientific terms used herein have the same meaning as commonly understood by those skilled in the art, to which the present disclosure belongs. The terms used in the specification of the present disclosure are only for the purpose of describing specific embodiments, but not intended to limit the invention. The term "and/or" includes any and all combinations of one or more related listed items.

Figure 1:
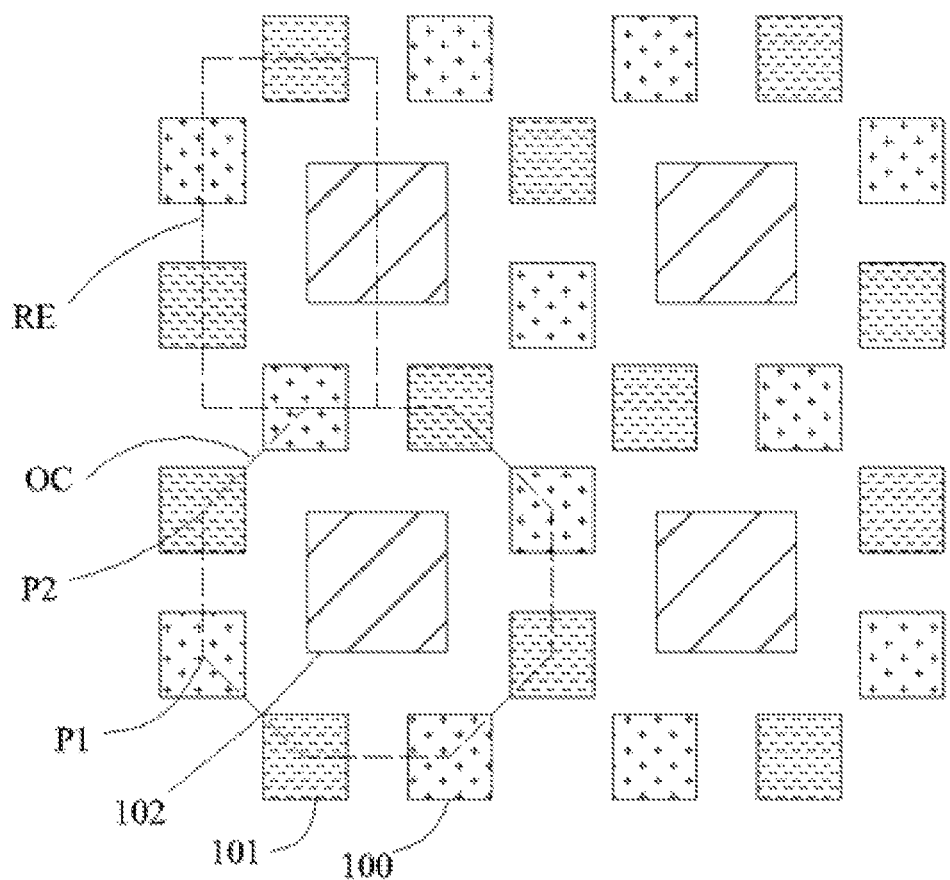
FIG. 1 is a schematic structural diagram of an OLED pixel arrangement structure according to a first embodiment of the present disclosure.

Reference is made to FIG. 1, which is a schematic structural diagram of an OLED pixel arrangement structure according to a first embodiment. The OLED pixel arrangement structure includes multiple first sub-pixels 100, multiple second sub-pixels 101, and multiple third sub-pixels 102. Four adjacent ones of the first sub-pixels 100 and four adjacent one of the second sub-pixels 101 are alternately arranged and surround one of the third sub-pixels 102. Centers of the four adjacent first sub-pixels 100 and centers of the four adjacent second sub-pixels 101 form vertexes of a virtual octagonal cell OC, and the virtual octagonal cell OC has at least two orthogonal symmetry axes. Among the first sub-pixels 100 and the second sub-pixels 101 of the virtual octagonal cell OC and the third sub-pixel 102 inside the virtual octagonal cell OC, a basic pixel unit is formed by the first sub-pixels 100, the second sub-pixels 101 and a part of the third sub-pixel 102 which are located on one side of one of the at least two orthogonal symmetry axes of the virtual octagonal cell OC. A center of the third sub-pixel 102 coincides with a center of the virtual octagonal cell OC. It can be understood as the followings. The first sub-pixel 100 is separated from the third sub-pixel 102, and a center of the first sub-pixel 100 is located at a first vertex P1 of the virtual octagonal cell OC. The second sub-pixel 101 is separated from the first sub-pixel 100 and the third sub-pixel 102, and a center of the second sub-pixel 101 is located at a second vertex P2 of the virtual octagonal cell OC. The second vertex P2 is adjacent to the first vertex P1.

In such a way, the multiple first sub-pixels, the multiple second sub-pixels, and the multiple third sub-pixels are repeatedly arranged in the structure of the virtual octagonal cell, and the basic pixel unit is defined as a half of the virtual octagonal cell, which overcomes limitations of an FMM manufacturing process and a coating process. Therefore, a PPI value and resolution of OLED display are effectively improved, and image quality and effect of the OLED display are improved.

In the embodiment, the four first sub-pixels 100 and the four second sub-pixels 101 are alternately arranged to form the virtual octagonal cell OC. In other embodiments, the four first sub-pixels 100 and the four second sub-pixels 101 may also arranged in other structures to form the virtual octagonal cell OC. For example, two of the first sub-pixels 100 are determined as a group, two of the second sub-pixels 101 are determined as a group, and two groups of the first sub-pixels 100 and two groups of the second sub-pixels 101 are alternately arranged.

In the embodiment, the OLED pixel arrangement structure is formed by the first sub-pixel 100, the second sub-pixel 101 and the third sub-pixel 102. The multiple first sub-pixels 100, the multiple second sub-pixels 101 and the multiple third sub-pixels 102 form multiple basic pixel units, which are repeated units of single pixel. The basic pixel unit is illustrated as a virtual rectangle frame RE. Each basic pixel unit includes two and one-half of the first sub-pixels 100, two and one-half of the second sub-pixels 101, and one-half of one of the third sub-pixels 102. The centers of the first sub-pixels 100 and the second sub-pixels 101 in two adjacent basic pixel units sharing one of the third sub-pixels 102 can be connected together to form the virtual octagonal cell OC. The center of the first sub-pixel 100 and the center of the second sub-pixel 101 coincide with the first vertex P1 and the second vertex P2 of the virtual octagonal cell OC, respectively. The first sub-pixels 100 and the second sub-pixels 101 are arranged alternately and repeatedly. The central of the third sub-pixel 102 coincides with the center of the virtual octagonal cell OC. It can also be understood as that, the first sub-pixels 100 and the second sub-pixels 101 in two adjacent basic pixel units sharing one of the third sub-pixels 102 are arranged around the shared third sub-pixel 102, and the first sub-pixels 100 and the second sub-pixels 101 are alternately arranged.

Nine sub-pixels which are arranged at the first vertexes P1, the second vertexes P2, and the center of the virtual octagonal cell OC form a group of sub-pixels, which is repeatedly arranged in a pixel plane of a display device. Since the first sub-pixel 100 at the first vertex P1 and the second sub-pixel 101 at the second vertex P2 of the virtual octagonal cell OC are shared by two virtual octagonal cells, the first sub-pixel 100 and the second sub-pixel 101 are each considered as only one-half sub-pixel in counting the number of the sub-pixels. Therefore, each virtual octagonal cell OC contains 4×½, i.e., two of the first sub-pixels and 4×½, i.e., two of the second sub-pixels, and the third sub-pixel 102 at the center of each virtual octagonal cell OC is considered as one sub-pixel, that is, each virtual octagonal cell OC contains one of the third sub-pixels. In summary, a ratio of the numbers of the first sub-pixels, the second sub-pixels and the third sub-pixels contained in each virtual octagonal cell OC is 2:2:1. That is, a ratio of the numbers of the first sub-pixels, the second sub-pixels and the third sub-pixels in the display device is 2:2:1.

In the embodiment, the virtual octagonal cell OC is a regular octagon.

Figure 2:
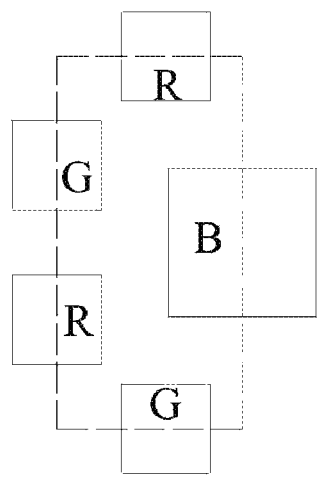
FIG. 2 is a schematic structural diagram of a basic pixel unit in FIG. 1 according to an embodiment of the present disclosure.
Figure 3:
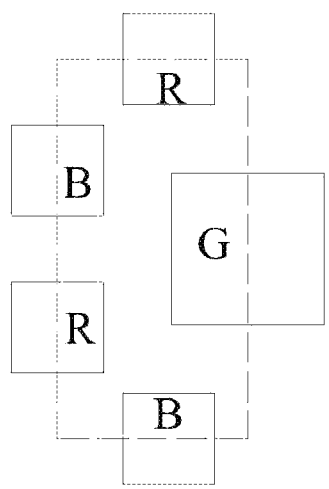
FIG. 3 is a schematic structural diagram of a basic pixel unit in FIG. 1 according to another embodiment of the present disclosure.

Reference is made to FIGS. 1 to 3. The sides of the virtual rectangle frame RE pass through centers of five sub-pixels, and the virtual rectangle frame RE contains one-half of each of the five sub-pixels. That is, the sides of the virtual rectangle frame RE pass through a pair of the first sub-pixels 100, a pair of the second sub-pixels 101 and one of the third sub-pixels 102. Since each of the first sub-pixel 100, the second sub-pixel 101 and the third sub-pixel 102 in the virtual rectangle frame RE is shared by two virtual rectangle frames, each virtual rectangle frame RE contains one (2×½=1) of the first sub-pixels, one (2×½=1) of the second sub-pixels, and one-half of one of the third sub-pixels. Therefore, the basic pixel unit of the display device is composed of 2.5 sub-pixels. It can also be understood as that one of the third sub-pixels is shared by two basic pixel units.

According to practical situations, emitting colors of the first sub-pixel 100, the second sub-pixel 101 and the third sub-pixel 102 may be any one of red, green and blue, and the emitting colors of the first sub-pixel 100, the second sub-pixel 101 and the third sub-pixel 102 are different from each other. In general, a blue luminescent material has the lowest luminous efficiency and lifespan, the efficiency and lifespan of a red luminescent material is higher than those of the blue luminescent material, and a green luminescent material has the highest efficiency and lifespan. Therefore, in designing a pixel area and pixel arrangement, a area relation between sub-pixels may be adjusted to balance impacts of materials, which means that the area of blue luminescent sub-pixels is the largest, the area of red luminescent sub-pixels takes the second place, and the area of green luminescent sub-pixels is the smallest.

Reference is made to FIG. 2, which is a schematic structural diagram of a basic pixel unit in FIG. 1 according to an embodiment. In the embodiment, the first sub-pixel 100 is a red sub-pixel R, the second sub-pixel 101 is a green sub-pixel Q and the third sub-pixel 102 is a blue sub-pixel B. In the embodiment of color arrangement, each basic pixel unit contains one red sub-pixel, one green sub-pixel and one-half blue sub-pixel.

Reference is made to FIG. 3, which is a schematic structural diagram of a basic pixel unit in FIG. 1 according to another embodiment. In the embodiment, the first sub-pixel 100 is a red sub-pixel R, the second sub-pixel 101 is a green sub-pixel B, and the third sub-pixel 102 is a blue sub-pixel G. In the embodiment of color arrangement, each basic pixel unit contains one red sub-pixel, one blue sub-pixel and one-half green sub-pixel.

It should be noted that, the first sub-pixel 100, the second sub-pixel 101 and the third sub-pixel 102 in the above embodiments are square, are distances between the first sub-pixel 100, the second sub-pixel 101 and the third sub-pixel 102, and the area of each sub-pixel are not considered. However, in practical display panel manufacture, the pixel arrangement, the shape and size of the pixels, and distances between sub-pixels are restricted by factors of the process accuracy of preparing a metal mask plate, an insulation layer for pixel division and coating, luminous efficiency of a material, driving design, and the like.

Figure 4:
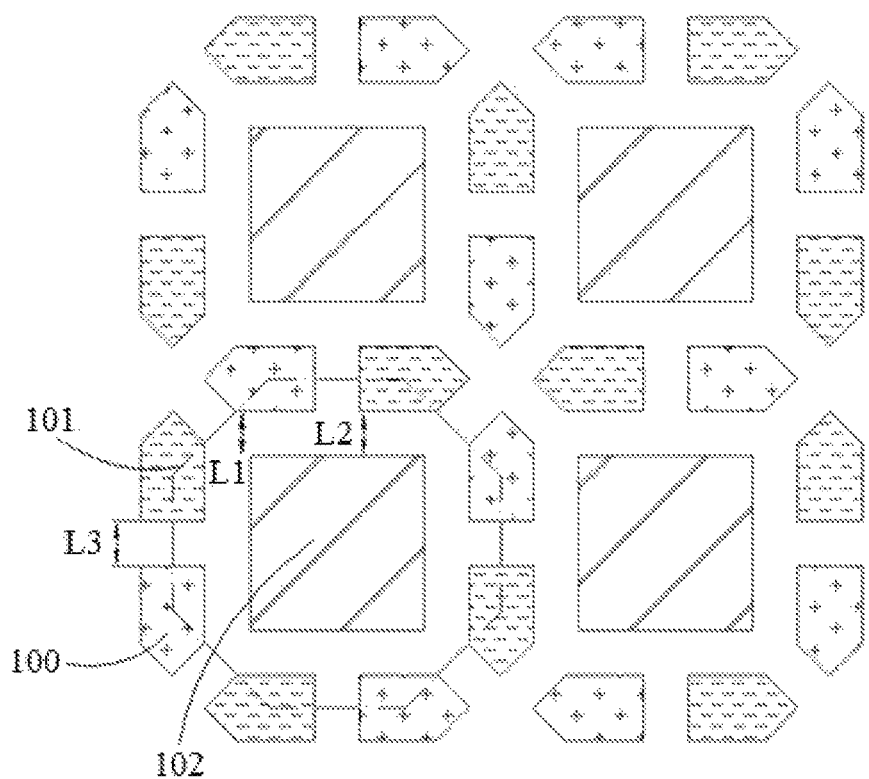
FIG. 4 is a schematic structural diagram of an OLED pixel arrangement structure according to a second embodiment of the present disclosure.

Reference is made to FIG. 4, which is a schematic structural diagram of an OLED pixel arrangement structure according to a second embodiment. In contrast to the first embodiment of the present disclosure, the factors influencing the pixel arrangement, the shape of the pixel, the size of the pixel and the distances between sub-pixels, which are mentioned in the above, are taken into consideration in the embodiment. The first sub-pixel 100 and the second sub-pixel 101 are symmetrical pentagons with symmetry axes coinciding with sides of the virtual octagonal cell OC. The first sub-pixel 100 and the second sub-pixel 101 are alternately arranged. It can be understood that, according to practical situations, the first sub-pixel 100, the second sub-pixel 101, and the third sub-pixel 102 may be other polygon, such as a triangle, a quadrilateral, a hexagon, a heptagon, and an octagon.

In the embodiment, $L1=L2=L3$, where L3 denotes a minimum distance between the first sub-pixel 100 and the second sub-pixel 101, L1 denotes a minimum distance between the first sub-pixel 100 and the third sub-pixel 102, L2 denotes a minimum distance between the second sub-pixel 101 and the third sub-pixel 102. That is, the minimum distances between any two of the three sub-pixels are equal in the embodiment. It can be understood that, according to practical situations, there may be any other relation of distances among the three sub-pixels in other embodiments, such as $L1>L2=L3$.

Emitting colors of the first sub-pixel 100, the second sub-pixel 101 and the third sub-pixel 102 may be any one of red, green and blue, and the emitting colors of the first sub-pixel 100, the second sub-pixel 101 and the third sub-pixel 102 are different from each other. In the embodiment, the first sub-pixel 100 is a red sub-pixel R, the second sub-pixel 101 is a green sub-pixel G, and the third sub-pixel 102 is a blue sub-pixel B. That is, in the embodiment of color arrangement, each basic pixel unit contains one red sub-pixel, one green sub-pixel and one-half blue sub-pixel.

The areas of the first sub-pixel, the second sub-pixel, and the third sub-pixel may be the same or different, depending on practical situations. In the embodiment, the area of the third sub-pixel 102 (the blue sub-pixel B) located at the center of the virtual octagonal cell OC is the largest, the area of the first sub-pixel 100 (the red sub-pixel R) takes the second place, and the area of the second sub-pixel (the green sub-pixel G) is the smallest.

Figure 5:
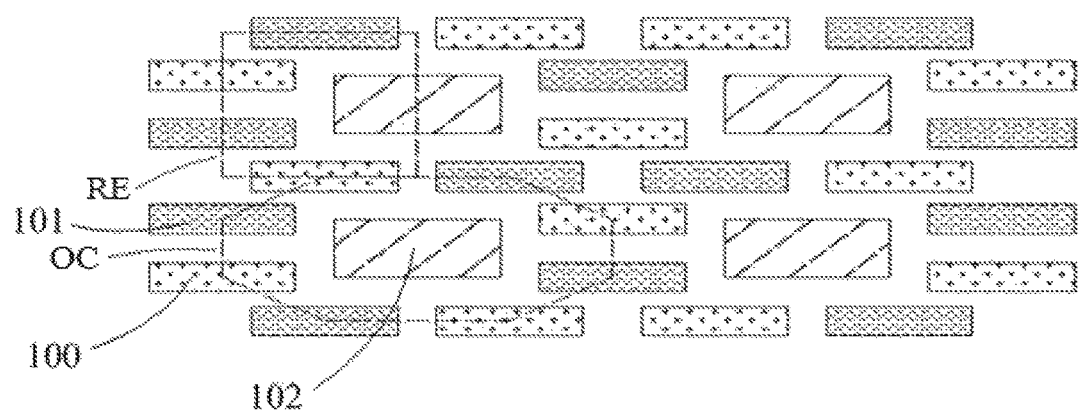
FIG. 5 is a schematic structural diagram of an OLED pixel arrangement structure according to a third embodiment of the present disclosure.

Reference is made to FIG. 5, which is a schematic structural diagram of an OLED pixel arrangement structure according to a third embodiment.

In contrast to the first embodiment of the present disclosure, the virtual octagonal cell OC in the present embodiment is a non-equilateral octagon with two orthogonal symmetry axes. Centers of the first sub-pixel 100 and the second sub-pixel 101 coincide with vertexes of the virtual octagonal cell OC, the center of the third sub-pixel 102 coincides with the center of the virtual octagonal cell OC, and four first sub-pixels 100 and four second sub-pixels 101 are alternately arranged at the eight vertexes of the virtual octagonal cell OC. The first sub-pixel, the second sub-pixel and the third sub-pixel are rectangular.

Emitting colors of the first sub-pixel 100, the second sub-pixel 101 and the third sub-pixel 102 may be any one of red, green and blue, and the emitting colors of the first sub-pixel 100, the second sub-pixel 101 and the third sub-pixel 102 are different from each other. In the embodiment, the first sub-pixel 100 is a red sub-pixel R, the second sub-pixel 101 is a green sub-pixel G and the third sub-pixel 102 is a blue sub-pixel B. That is, in the embodiment of color arrangement, each basic pixel unit contains one red sub-pixel, one green sub-pixel and one-half blue sub-pixel.

A display device is further provided according to an embodiment. The display device includes the above OLED pixel arrangement structure.

In the OLED pixel arrangement structure and the display device according to the embodiments, the multiple first sub-pixels, the multiple second sub-pixels, and the multiple third sub-pixels are repeatedly arranged in the structure of the virtual octagonal cell, and the basic pixel unit is defined as a half of the virtual octagonal cell, which overcomes limitations of an FMM manufacturing process and a coating process. Therefore, a PPI value and resolution of OLED display are effectively improved, and image quality and effect of the OLED display are improved.

Various technical features in the above embodiments can be arbitrarily combined, and not all possible combinations of the various technical features in the above embodiments are described for sake of conciseness. All combinations of these technical features without contradiction should be determined within the scope of the specification.

The description and application of the present disclosure are illustrative, and the above embodiments are not intended to limit the scope of the present disclosure. Variations and modifications can be made to the disclosed embodiments, and substitutions and equivalents of various components in the embodiments are well known to those skilled in the art. It should be apparent to those skilled in the art that the present disclosure can be embodied in other forms, structures, arrangements, proportions, or other assemblies, materials and components without departing from the spirit or essential features of the present disclosure. Other variations and modifications can be made to the disclosed embodiments without departing from the scope and spirit of the present disclosure.

The invention claimed is:

1. An OLED pixel arrangement structure, comprising a plurality of first sub-pixels, a plurality of second sub-pixels and a plurality of third sub-pixels, wherein
   four adjacent ones of the first sub-pixels and four adjacent ones of the second sub-pixels are alternately arranged and surround one of the third sub-pixels;
   centers of the four adjacent first sub-pixels and centers of the four adjacent second sub-pixels form vertexes of a virtual octagonal cell, the virtual octagonal cell has at least two orthogonal symmetry axes;
   a basic pixel unit is formed by the first sub-pixels and the second sub-pixels forming the virtual octagonal cell and a part of the third sub-pixel inside the virtual octagonal cell which are located on one side of one of the at least two orthogonal symmetry axes of the virtual octagonal cell; and
   a center of the third sub-pixel coincides with a center of the virtual octagonal cell.

2. The OLED pixel arrangement structure according to claim 1, wherein a ratio of the numbers of the first sub-pixels, the second sub-pixels and the third sub-pixels contained in each virtual octagonal cell is 2:2:1.

3. The OLED pixel arrangement structure according to claim 2, wherein each basic pixel unit contains one of the first sub-pixels, one of the second sub-pixels and one-half of one of the third sub-pixels.

4. The OLED pixel arrangement structure according to claim 1, wherein the virtual octagonal cell is a regular octagon or a non-equilateral octagon with two orthogonal symmetry axes.

5. The OLED pixel arrangement structure according to claim 1, wherein the first sub-pixels, the second sub-pixels and the third sub-pixels are in a shape of polygon.

6. The OLED pixel arrangement structure according to claim 5, wherein the first sub-pixels, the second sub-pixels and the third sub-pixels are in a shape of square.

7. The OLED pixel arrangement structure according to claim 1, wherein
   emitting colors of the first sub-pixels, the second sub-pixels and the third sub-pixels are any one of red, green and blue, and
   the emitting colors of the first sub-pixels, the second sub-pixels and the third sub-pixels are different from each other.

8. The OLED pixel arrangement structure according to claim 7, wherein the first sub-pixels are red sub-pixels, and an area of each of the first sub-pixels is larger than an area of each of the second sub-pixels;
   the second sub-pixels are green sub-pixels; and
   the third sub-pixels are blue sub-pixels, and an area of each of the third sub-pixels is larger than an area of each of the first sub-pixels.

9. The OLED pixel arrangement structure according to claim 7, wherein a minimum distance between the first sub-pixels and the second sub-pixels, a minimum distance between the first sub-pixels and the third sub-pixels, and a minimum distance between the second sub-pixels and the third sub-pixels are equal.

10. A display device, comprising an OLED pixel arrangement structure, wherein,
    the OLED pixel arrangement structure comprises a plurality of first sub-pixels, a plurality of second sub-pixels and a plurality of third sub-pixels;
    four adjacent ones of the first sub-pixels and four adjacent ones of the second sub-pixels are alternately arranged and surround one of the third sub-pixels;
    centers of the four adjacent first sub-pixels and centers of the four adjacent second sub-pixels form vertexes of a virtual octagonal cell, the virtual octagonal cell has at least two orthogonal symmetry axes;
    a basic pixel unit is formed by the first sub-pixels and the second sub-pixels forming the virtual octagonal cell and a part of the third sub-pixel inside the virtual octagonal cell which are located on one side of one of the at least two orthogonal symmetry axes of the virtual octagonal cell; and
    a center of the third sub-pixel coincides with a center of the virtual octagonal cell.

11. The display device according to claim 10, wherein a ratio of the numbers of the first sub-pixels, the second sub-pixels and the third sub-pixels contained in each virtual octagonal cell is 2:2:1.

12. The display device according to claim 11, wherein each basic pixel unit contains one of the first sub-pixels, one of the second sub-pixels and one-half of one of the third sub-pixels.

13. The display device according to claim 10, wherein the virtual octagonal cell is a regular octagon or a non-equilateral octagon with two orthogonal symmetry axes.

14. The display device according to claim 10, wherein the first sub-pixels, the second sub-pixels and the third sub-pixels are in a shape of polygon.

15. The display device according to claim 14, wherein the first sub-pixels, the second sub-pixels and the third sub-pixels are in a shape of square.

16. The display device according to claim 10, wherein
    emitting colors of the first sub-pixels, the second sub-pixels and the third sub-pixels are any one of red, green and blue, and
    the emitting colors of the first sub-pixels, the second sub-pixels and the third sub-pixels are different from each other.

17. The display device according to claim 16, wherein the first sub-pixels are red sub-pixels, and an area of each of the first sub-pixels is larger than an area of each of the second sub-pixels;
    the second sub-pixels are green sub-pixels; and the third sub-pixels are blue sub-pixels, and an area of each of the third sub-pixels is larger than an area of each of the first sub-pixels.

18. The display device according to claim 16, wherein a minimum distance between the first sub-pixels and the second sub-pixels, a minimum distance between the first sub-pixels and the third sub-pixels, and a minimum distance between the second sub-pixels and the third sub-pixels are equal.

* * * * *